US008885378B2

(12) United States Patent
Lauer

(10) Patent No.: US 8,885,378 B2
(45) Date of Patent: Nov. 11, 2014

(54) IDENTIFYING A RESULT USING MULTIPLE CONTENT-ADDRESSABLE MEMORY LOOKUP OPERATIONS

(71) Applicant: Craig A. Lauer, Bolton, MA (US)

(72) Inventor: Craig A. Lauer, Bolton, MA (US)

(73) Assignee: Cisco Technology, Inc., San Jose, CA (US)

( * ) Notice: Subject to any disclaimer, the term of this patent is extended or adjusted under 35 U.S.C. 154(b) by 58 days.

(21) Appl. No.: 13/847,606

(22) Filed: Mar. 20, 2013

(65) Prior Publication Data

US 2014/0286072 A1  Sep. 25, 2014

(51) Int. Cl.
*G11C 15/00* (2006.01)
(52) U.S. Cl.
CPC ...................................... *G11C 15/00* (2013.01)
USPC ...................... 365/49.1; 365/49.17; 365/49.18
(58) Field of Classification Search
USPC .................................. 365/49.1, 49.17, 49.18
See application file for complete search history.

(56) References Cited

U.S. PATENT DOCUMENTS

| | | | | |
|---|---|---|---|---|
| 7,237,059 | B2 * | 6/2007 | Eatherton et al. | 365/49.17 |
| 7,441,074 | B1 * | 10/2008 | Panigrahy et al. | 365/49.1 |
| 7,581,059 | B2 * | 8/2009 | Gupta et al. | 365/49.1 |
| 7,822,916 | B1 * | 10/2010 | Wen | 365/49.1 |
| 7,848,129 | B1 * | 12/2010 | Deshpande et al. | 365/49.1 |
| 7,852,653 | B2 * | 12/2010 | Wickeraad et al. | 365/49.1 |
| 8,619,451 | B1 * | 12/2013 | Argyres | 365/49.1 |

* cited by examiner

*Primary Examiner* — Trong Phan
(74) *Attorney, Agent, or Firm* — The Law Office of Kirk D. Williams

(57) ABSTRACT

In one embodiment, a first search operation is performed based on a base lookup word on a first plurality of content-addressable memory entries of an overall plurality of priority-ordered content-addressable memory entries to identify a first matching entry and a corresponding first overall search position of the first matching entry within the overall plurality of priority-ordered content-addressable memory entries. A second search operation is performed based on the base lookup word on a second plurality of content-addressable memory entries of the overall plurality of priority-ordered content-addressable memory entries to identify a second matching entry and a corresponding second overall search position of the second matching entry within the overall plurality of priority-ordered content-addressable memory entries. The corresponding first overall search position is compared to the corresponding second overall search position to determine the overall search result.

20 Claims, 4 Drawing Sheets

IDENTIFYING A RESULT USING MULTIPLE CONTENT-ADDRESSABLE MEMORY LOOKUP OPERATIONS

TECHNICAL FIELD

The present disclosure relates generally to content-addressable memory devices, such as, but not limited to, those used in forwarding packets in a communications network.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology.

Content-addressable memories (CAMs), including, but not limited to, binary content-addressable memories (binary CAMs) and ternary content-addressable memories (ternary CAMs or TCAMs) are often used in packet switching device in processing of packets. Each entry of a binary CAM typically includes a value for matching against, while each TCAM entry typically includes a value and a mask. The binary or ternary CAM compares a lookup word against all of the entries in parallel, and typically generates an indication of the highest priority entry that matches the lookup word. An entry matches the lookup word in a binary CAM if the lookup word and the entry value are identical, while an entry matches the lookup word in a TCAM if the lookup word and the entry value are identical in the bits that are not indicated by the mask as being irrelevant to the comparison operations.

BRIEF DESCRIPTION OF THE DRAWINGS

The appended claims set forth the features of one or more embodiments with particularity. The embodiment(s), together with its advantages, may be best understood from the following detailed description taken in conjunction with the accompanying drawings of which:

DESCRIPTION OF EXAMPLE EMBODIMENTS

1. Overview

Figure 1:
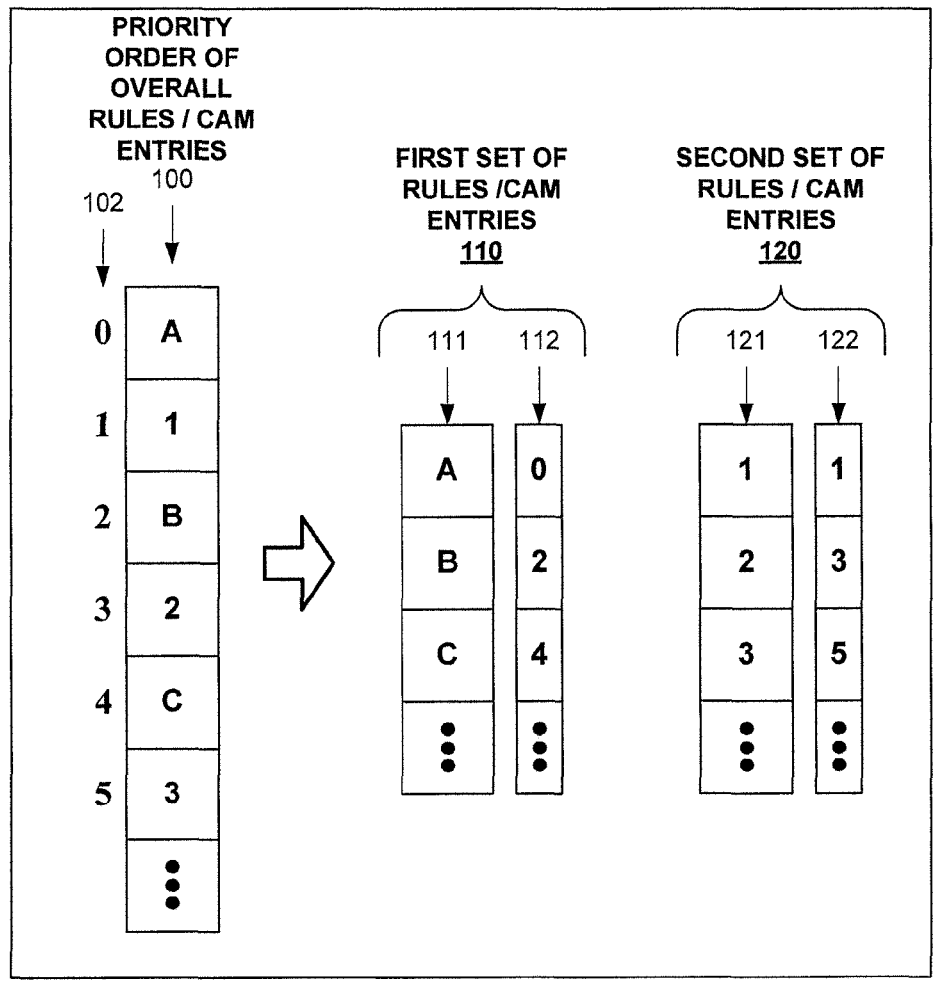
FIG. 1 illustrates partitioning of a lookup operation into multiple lookup operations according to one embodiment.

Disclosed are, inter alia, methods, apparatus, computer-storage media, mechanisms, and means associated with identifying a result using multiple content-addressable memory (CAM) lookup operations. One embodiment performs a first search operation based on a base lookup word on a first plurality of content-addressable memory entries of an overall plurality of priority-ordered content-addressable memory entries to identify a first matching entry and a corresponding first overall search position of the first matching entry within the overall plurality of priority-ordered content-addressable memory entries. A second search operation is performed based on the base lookup word on a second plurality of content-addressable memory entries of the overall plurality of priority-ordered content-addressable memory entries to identify a second matching entry and a corresponding second overall search position of the second matching entry within the overall plurality of priority-ordered content-addressable memory entries. The corresponding first overall search position is compared to the corresponding second overall search position to determine that first matching entry is an overall search result based on the corresponding first overall search position corresponding to a higher-priority entry than the corresponding second overall search position.

2. Description

Disclosed are, inter alia, methods, apparatus, computer-storage media, mechanisms, and means associated with identifying a result using multiple content-addressable memory (CAM) lookup operations. Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. A processing element may be a general processor, task-specific processor, or other implementation for performing the corresponding processing. The embodiments described hereinafter embody various aspects and configurations, with the figures illustrating exemplary and non-limiting configurations. Note, computer-readable media and means for performing methods and processing block operations (e.g., a processor and memory or other apparatus configured to perform such operations) are disclosed and are in keeping with the extensible scope and spirit of the embodiments. Note, the term "apparatus" is used consistently herein with its common definition of an appliance or device.

Note, the steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also note, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC §101 machine statutory class.

FIG. 1 illustrates partitioning of a lookup operation into multiple lookup operations according to one embodiment. Shown is a priority order list (100) of overall rules (e.g., access control list entries) or content-addressable memory (CAM) entries. Each of these rules or CAM entries A, 1, B, C, etc. (100) represent one or more rules or entries, with each of their corresponding priority-ordered search position (102) illustrated.

This list of rules/CAM entries is processed to generate two sets of rules or CAM entries 110 and 120. First set of rules or CAM entries 110 includes the actual rules or CAM entries 111 and their associated search order position 112, which is the same as search order position 102. Second set of rules or CAM entries 120 includes the actual rules or CAM entries 121 and their associated search order position 122, which is the same as search order position 102.

In one embodiment, a single lookup operation on a set or rules or CAM entries (100) is partitioned into multiple lookup operations on different sets of rules or CAM entries (111, 121) which are associated with their original overall search order position (102, 112, 122).

Figure 2:
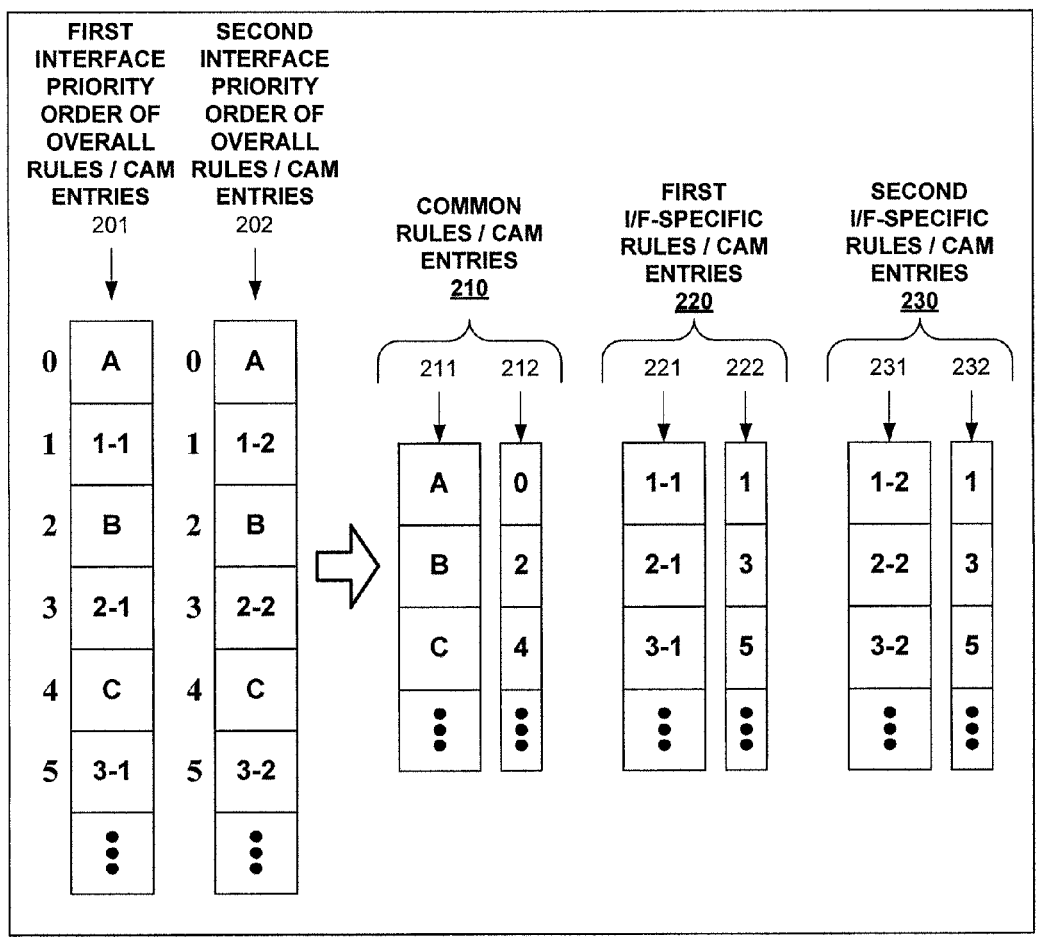
FIG. 2 illustrates partitioning of a lookup operation into multiple lookup operations according to one embodiment.

FIG. 2 illustrates partitioning of a lookup operation into multiple lookup operations according to one embodiment. In one embodiment, the original rule or CAM entries 201, 202 may include some same rules or CAM entries.

For example, one embodiment is related to packet switching operations in a packet switching device. A corresponding access control list is applied at each interface for each of the ingress and egress directions. Looking at these access control lists, it can be observed that often there is a common set of access control list rules that will be applied to all or multiple interfaces. We refer to these rules or CAM entries herein as common rules or CAM entries. There are also rules or CAM entries that are applied only to one of the interfaces (typically in either the egress or ingress direction). We refer to these rules or CAM entries herein as interface-specific rules or CAM entries.

Shown in FIG. 2 are two sets of original rules or CAM entries 201 and 202, which include common rules or CAM entries shown as A, B, and C, and interface-specific rules or CAM entries shown as 1-1, 1-2, 2-1, 2-2, 3-1, and 3-2. One embodiment partitions sets of rules or CAM entries 201 and 202 into three sets of rules or CAM entries 210, 220, and 230. Common rules or CAM entries 210 includes the actual rules or CAM entries 211 and their corresponding original overall search order 212. Interface-specific rules or CAM entries 220 includes the actual rules or CAM entries 221 and their corresponding original overall search order 222. Interface-specific rules or CAM entries 230 includes the actual rules or CAM entries 231 and their corresponding original overall search order 232.

Instead of performing a lookup operation on rules or CAM entries 201, one embodiment performs two lookup operations: (1) a lookup operation on common rules or CAM entries 210, and (2) a lookup operation on interface-specific rules or CAM entries 220. If a match is located in each of the two searches, the corresponding overall search position values (212, 222) of each of the matching entries is compared to determine the higher-priority match (e.g., the one with the lower overall search position value). Thus, a same result is produced whether searching rules or CAM entries 201, or both rules or CAM entries 210 and 220.

Similarly, instead of performing a lookup operation on rules or CAM entries 202, one embodiment performs two lookup operations: (1) a lookup operation on common rules or CAM entries 210, and (2) a lookup operation on interface-specific rules or CAM entries 230. If a match is located in each of the two searches, the corresponding overall search position values (212, 232) of each of the matching entries is compared to determine the higher-priority match (e.g., the one with the lower overall search position value). Thus, a same result is produced whether searching rules or CAM entries 202, or both rules or CAM entries 210 and 230.

One embodiment uses multiple lookup operations of subsets of rules or CAM entries instead of a single lookup operation on all of the rules or CAM entries, which may decrease (possibly dramatically) the storage space or CAM entries required as a single storage or set of CAM entries for the common rules or entries can be used for multiple interfaces, instead of having an independent copy for each interface. In particular, CAM entry space is often limited in packet switching devices, so this tradeoff provides a great advantage in one embodiment. As CAM devices are often the lookup mechanisms employed, herein CAM entries will often be referenced, with these teachings applicable to rules and/or lookup mechanisms.

Figure 3A:
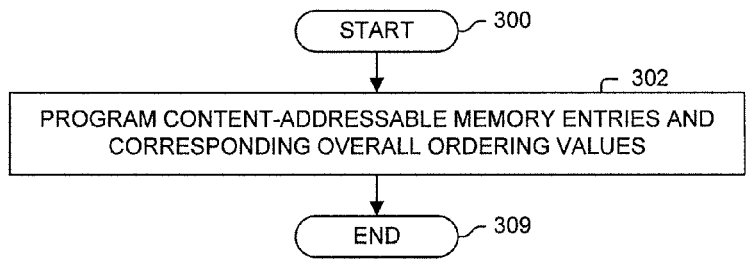
FIG. 3A illustrates a process performed in one embodiment.

FIG. 3A illustrates a process performed in one embodiment. Processing begins with process block 300. In process block 302, the binary or ternary (or other) content-addressable memory (CAM) entries and their corresponding overall ordering values are programmed so that search operations can be performed. In one embodiment, a CAM device will provide an index of a matching CAM entry as well as its corresponding overall search order position. However, typically, a CAM device will provide an index of a matching CAM entry and then this position is used to determine a corresponding position in memory which is read to retrieve the corresponding overall search order position. The one embodiment is programmed accordingly. Processing of the flow diagram of FIG. 3A is complete as indicated by process block 309.

Figure 3B:
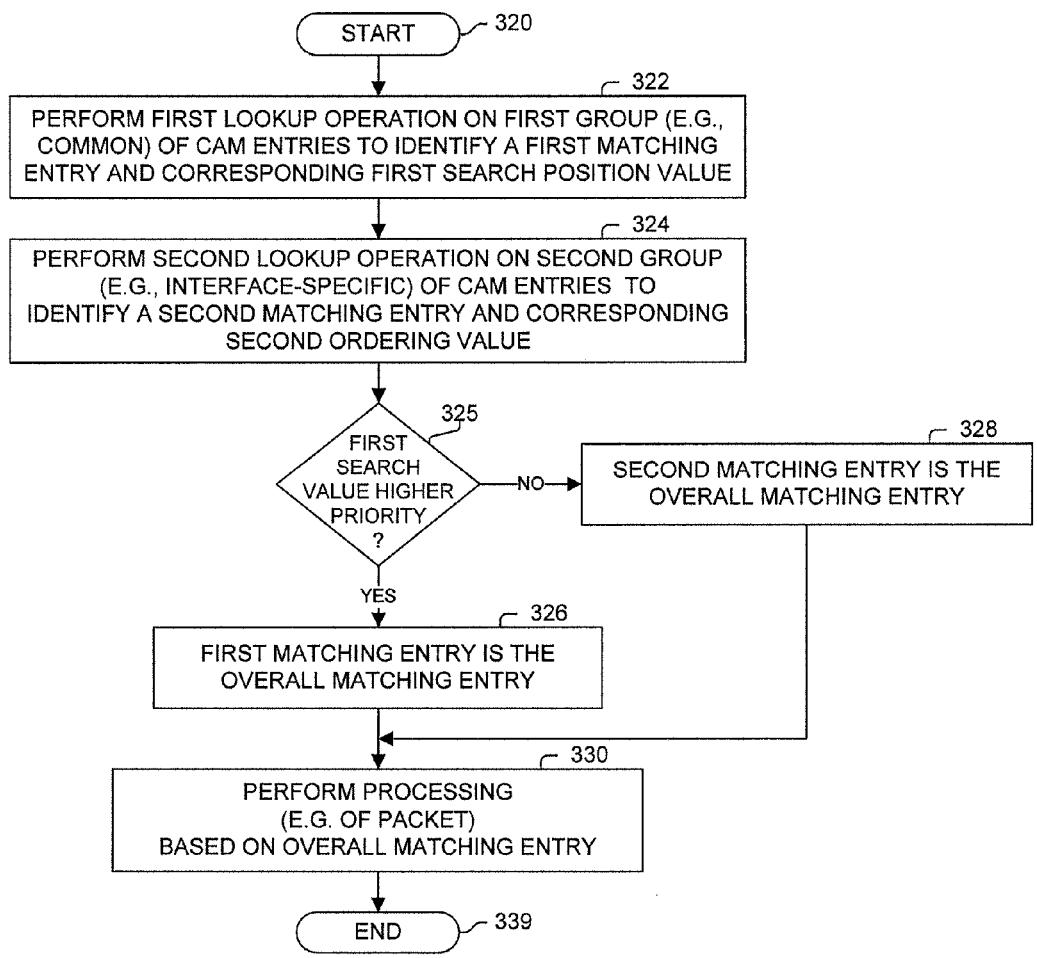
FIG. 3B illustrates a process performed in one embodiment.

FIG. 3B illustrates a process performed in one embodiment for identifying a result using multiple content-addressable memory (CAM) lookup operations. Processing begins with process block 320. In process block 322, a first lookup operation is performed on a first group (e.g., common) CAM entries to identify a first matching entry and corresponding first overall search position value (e.g., in the original search order). In process block 324, a second lookup operation is performed on a first group (e.g., interface-specific) CAM entries to identify a second matching entry and corresponding second overall search position value (e.g., in the original search order). As determined in process block 325, if the first overall search position value has higher priority than the second search position value, then the first matching entry is the overall matching entry (per process block 326); else the second matching entry is the overall matching entry (per process block 328). In process block 330, processing is performed based on the overall matching entry. In one embodiment, this processing includes processing of a packet in a packet switching device. Processing of the flow diagram of FIG. 3B is complete as indicated by process block 339.

Figure 4A:
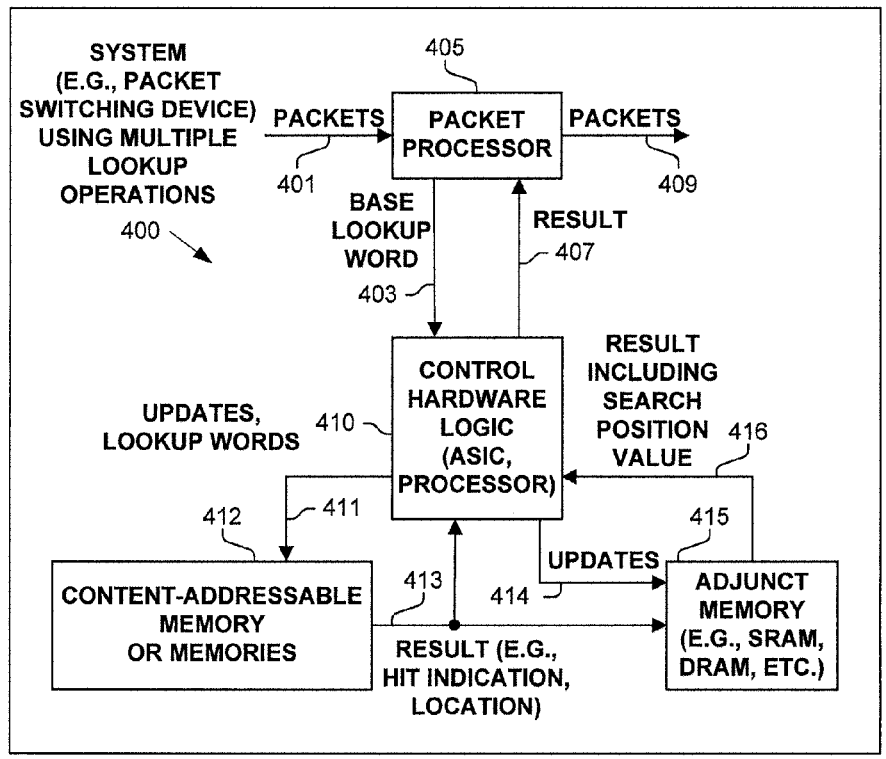
FIG. 4A illustrates a device according to one embodiment.

FIG. 4A illustrates a system (e.g., packet switching device) 400 associated with identifying a result using multiple content-addressable memory (CAM) lookup operations. System 400 may be, for example, part of a packet switching device, router, communications, computer or any other system or component.

In one embodiment, packets 401 are received by packet processor 405. In addition to other operations (e.g., packet routing, security, etc.), packet processor 405 typically generates a base lookup word 403 which is provided to control logic 410. The term "base" lookup value is used because CAMs can be partitioned into multiple virtual CAMs using one or more bits of each CAM entry to identify which virtual CAM is being searched. In one embodiment, a single CAM is used for the multiple lookup operations. In one embodiment, multiple CAMs (possibly performing their lookup operations in parallel) are used for the multiple lookup operations.

Control hardware logic (e.g., part of an ASIC, a programmed processor) receives base lookup word 403 and causes (411) multiple lookup operations to be performed thereon in CAM(s) 412, which generate the respective hit results 413. The corresponding overall search position results are provided (416) to control hardware logic 410, which determines the overall matching result from the two or more CAM lookup operations based on the respective overall search position values of the matching results. This overall result 407 is provided to packet processor 405, which processes one or more packets accordingly, including possibly forwarding packet(s) (409).

In one embodiment, control hardware logic 410 programs (411, 414) CAM(s) 412 and adjunct memory 415. In one embodiment, adjunct memory 415 includes the overall search position information as well as packet processing information (e.g., drop, priority values, etc.).

Figure 4B:
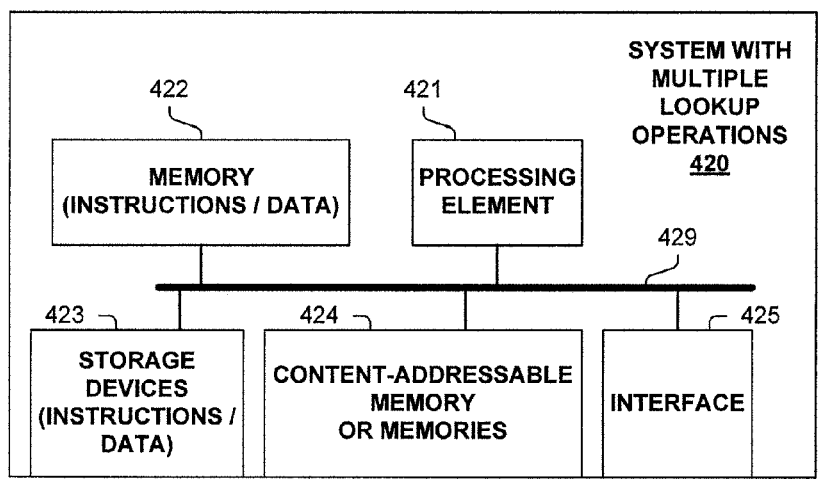
FIG. 4B illustrates an apparatus according to one embodiment.

FIG. 4B illustrates a system 420 associated with identifying a result using multiple content-addressable memory (CAM) lookup operations. System 420 may be, for example, part of a packet switching device, router, communications, computer or any other system or component. In one embodiment, system 420 performs one or more processes corresponding to one of the diagrams illustrated herein or otherwise described herein.

In one embodiment, system 420 includes a processing element 421, memory 422 (e.g., storing overall search position values and processing information), storage devices 423, one or more content-addressable memories 424 (for storing the entries on which multiple lookup operations will be performed), and an interface 425 for connecting to other devices, which are coupled via one or more communications mechanisms 429 (shown as a bus for illustrative purposes).

Various embodiments of system 420 may include more or less elements. The operation of system 420 is typically controlled by processing element 421 using memory 422 and storage devices 423 to perform one or more tasks or processes, such as programming CAM(s) 424 and memory 422, and performing multiple lookup operations using CAM(s) 424. Memory 422 is one type of computer readable media, and typically comprises random access memory (RAM), read only memory (ROM), flash memory, integrated circuits, and/or other memory components. Memory 422 typically stores computer executable instructions to be executed by processing element 421 and/or data which is manipulated by processing element 421 for implementing functionality in accordance with one embodiment of the invention. Storage devices 423 are another type of computer readable media, and typically comprise solid state storage media, disk drives, diskettes, networked services, tape drives, and other storage devices. Storage devices 423 typically store computer executable instructions to be executed by processing element 421 and/or data which is manipulated by processing element 421 for implementing functionality in accordance with one embodiment of the invention.

In one embodiment, processing element 421 provides base lookup words to content-addressable memory or memories 424, which perform the multiple lookup operations to generate lookup results with corresponding overall search order position information retrieved from memory 422. Processing element 421 uses this information to determine the overall lookup result.

In view of the many possible embodiments to which the principles of the disclosure may be applied, it will be appreciated that the embodiments and aspects thereof described herein with respect to the drawings/figures are only illustrative and should not be taken as limiting the scope of the disclosure. For example, and as would be apparent to one skilled in the art, many of the process block operations can be re-ordered to be performed before, after, or substantially concurrent with other operations. Also, many different forms of data structures could be used in various embodiments. The disclosure as described herein contemplates all such embodiments as may come within the scope of the following claims and equivalents thereof.

What is claimed is:

1. An apparatus, comprising:
   one or more content-addressable memories configured to store an overall plurality of priority-ordered content-addressable memory entries, and configured to perform content-addressable memory lookup operations to produce matching results;
   memory configured to store a plurality of lookup priority values, and configured to retrieve a particular lookup priority value of the plurality of lookup priority values based on a matching result; and
   control hardware logic configured to initiate a first lookup operation based on a base lookup word on a first plurality of the overall plurality of priority-ordered content-addressable memory entries stored in said one or more content-addressable memories to produce a first matching result, and then to retrieve a first lookup priority value from said memory based on the first matching result, and configured to initiate a second lookup operation based on the base lookup word on a second plurality of the overall plurality of priority-ordered content-addressable memory entries stored in said one or more content-addressable memories to produce a second matching result, and then to retrieve a second lookup priority value from said memory based on the second matching result; and configured to identify the first matching result as an overall matching result when the first lookup priority value is higher priority than the second lookup priority value and to identify the second matching result as the overall matching result when the second lookup priority value is higher priority than the first lookup priority value.

2. The apparatus of claim 1, wherein a packet switching device includes the apparatus.

3. The apparatus of claim 2, wherein the first plurality of the overall plurality of priority-ordered content-addressable memory entries are interface-specific entries, and the second plurality of the overall plurality of priority-ordered content-addressable memory entries are common entries for a plurality of interfaces.

4. The apparatus of claim 2, wherein the second plurality of the overall plurality of priority-ordered content-addressable memory entries are interface-specific entries, and the first plurality of the overall plurality of priority-ordered content-addressable memory entries are common entries for a plurality of interfaces.

5. The apparatus of claim 1, wherein the content-addressable memory entries are ternary content-addressable memory entries.

6. A method, comprising:
performing a first search operation based on a base lookup word on a first plurality of content-addressable memory entries of an overall plurality of priority-ordered content-addressable memory entries to identify a first matching entry and a corresponding first overall search position of the first matching entry within the overall plurality of priority-ordered content-addressable memory entries;
performing a second search operation based on the base lookup word on a second plurality of content-addressable memory entries of the overall plurality of priority-ordered content-addressable memory entries to identify a second matching entry and a corresponding second overall search position of the second matching entry within the overall plurality of priority-ordered content-addressable memory entries; and
comparing the corresponding first overall search position to the corresponding second overall search position to determine that first matching entry is an overall search result based on the corresponding first overall search position corresponding to a higher-priority entry than the corresponding second overall search position.

7. The method of claim 6, wherein at least one or more of the second plurality of content-addressable memory entries are interposed, in the priority-order of the priority-ordered content-addressable memory entries, between entries of the first plurality of content-addressable memory entries.

8. The method of claim 6, wherein the first search operations include performing a lookup operation on the first plurality of content-addressable memory entries to identify a first matching position, and retrieving a value representing the corresponding first overall search position of the first matching entry from memory at a location corresponding to the first matching position; and wherein the second search operations include performing a lookup operation on the second plurality of content-addressable memory entries to identify a second matching position, and retrieving a value representing the corresponding second overall search position of the second matching entry from memory at a location corresponding to the second matching position.

9. The method of claim 6, wherein the first matching entry comes after, in the priority-ordered content-addressable memory entries, one or more entries of the second plurality of content-addressable memory entries.

10. The method of claim 6, wherein the content-addressable memory entries are binary content-addressable memory entries.

11. The method of claim 6, wherein the content-addressable memory entries are ternary content-addressable memory entries.

12. The method of claim 6, wherein the method is performed by a packet switching device.

13. The method of claim 12, wherein the first plurality of content-addressable memory entries are interface-specific entries, and the second plurality of content-addressable memory entries are common entries for a plurality of interfaces.

14. The method of claim 12, wherein the second plurality of content-addressable memory entries are interface-specific entries, and the first plurality of content-addressable memory entries are common entries for a plurality of interfaces.

15. The method of claim 6, where the first and second plurality of content-addressable memory entries are stored in a same content-addressable memory.

16. The method of claim 6, where the first and second plurality of content-addressable memory entries are stored in different content-addressable memories.

17. A method, comprising:
performing a first common search operation based on a first base lookup word on a common plurality of content-addressable memory entries of an overall plurality of priority-ordered content-addressable memory entries to identify a first common matching entry and a corresponding first common overall search position of the first common matching entry;
performing a first interface-specific search operation based on the first base lookup word on a first interface-specific plurality of content-addressable memory entries of the overall plurality of priority-ordered content-addressable memory entries to identify a first interface-specific matching entry and a corresponding first interface-specific overall search position of the first interface-specific matching entry; and
determining the first overall lookup result is the first common matching entry or the first interface-specific matching entry based on the relative ordering of the corresponding first common overall search position and the corresponding first interface-specific overall search position.

18. The method of claim 17, comprising
performing a second common search operation based on a second base lookup word on the common plurality of content-addressable memory entries of the overall plurality of priority-ordered content-addressable memory entries to identify a second common matching entry and a corresponding second common overall search position of the first common matching entry;
performing a second interface-specific search operation based on the second base lookup word on a second interface-specific plurality of content-addressable memory entries of the overall plurality of priority-ordered content-addressable memory entries to identify a second interface-specific matching entry and a corresponding second interface-specific overall search position of the second interface-specific matching entry;
determining the second overall lookup result is the second common matching entry or the second interface-specific matching entry based on the relative ordering of the corresponding second common overall search position and the corresponding second interface-specific overall search position.

19. The method of claim 17, processing, by a packet switching device, a first packet based on the first overall lookup result, and a second packet based on the second overall lookup result.

20. The method of claim 17, wherein at least one or more of the first interface-specific plurality of content-addressable memory entries is interposed, in the priority-order of the overall plurality of priority-ordered content-addressable memory entries, between entries of the common plurality of content-addressable memory entries.

* * * * *